United States Patent [19]

Fontaine

[11] 4,019,039
[45] Apr. 19, 1977

[54] SYNCHROSCOPE SIMULATOR

[75] Inventor: Robert Richard Fontaine, Riverdale, Md.

[73] Assignee: The Singer Company, Binghamton, N.Y.

[22] Filed: Nov. 28, 1975

[21] Appl. No.: 635,577

[52] U.S. Cl. .............................. 235/184; 235/150.3; 324/91; 328/133

[51] Int. Cl.$^2$ .................... G06G 7/48; G01R 25/00

[58] Field of Search ............ 235/150.3, 151.3, 184; 178/69.5 R; 307/220, 233 R, 233 A; 328/13, 63, 72, 38, 34, 140, 141, 133, 134; 318/85, 165, 172, 175; 324/144, 91; 73/133 R

[56] References Cited

UNITED STATES PATENTS

| 691,834 | 1/1902 | Woodbridge | 324/91 |
|---|---|---|---|
| 2,358,439 | 9/1944 | Blok | 324/91 |
| 2,927,735 | 3/1960 | Scuitto | 235/150.3 |
| 3,184,663 | 5/1965 | Mergler | 318/85 |

OTHER PUBLICATIONS

Spencer, James: "Operation and Care of Circular-Scale Instruments;" *Instruments;* vol. 21, pp. 1016–1019.

Primary Examiner—Malcolm A. Morrison
Assistant Examiner—Errol A. Krass
Attorney, Agent, or Firm—Ronald Reichman; James C. Kesterson

[57] ABSTRACT

This invention relates to a system for simulating a power plant synchroscope in which a digital computer supplies the information which indicates when two alternators are, or are not, in synchronism. Digital words are supplied by the computer to two separate registers whose parallel outputs are applied to the inputs of two separate frequency multipliers, one for each register. A single oscillator supplies its output to the second inputs of both of the multiplier, and the frequency of the oscillator is therein multiplied by the value of the words from the computer. The outputs from the two multipliers are supplied to two separate channels, one representing each of the two alternators. The square waves in each channel are converted into sine waves which are then applied to the incoming and running windings of a standard synchroscope. In addition, the information in the two channels is applied to the inputs of a phase difference detector which produces a digital phase difference.

10 Claims, 2 Drawing Figures

SYNCHROSCOPE SIMULATOR

BACKGROUND OF THE INVENTION

1. Field of the Invention

This invention relates to electrical instrumentation and, more particularly, to the simulation of a synchroscope for paralleling two alternators.

2. Description of the Prior Art

Synchroscopes, of course, are old. The simulation of synchroscopes is only a few years old. Until simulators were required in which the paralleling of alternators was part of the training to be accomplished, there was no need to simulate synchroscopes. The early synchroscope simulators were relatively simple. A typical prior art synchroscope simulator comprised two separate oscillators, one of which was variable in frequency. The outputs from the oscillators were applied through suitable amplifiers, of course, to the two windings of a standard synchroscope. The frequency of the variable oscillator was controlled by the variation of an applied bias voltage, or a similar means, so that the two frequencies could be readily brought closer together.

SUMMARY OF THE INVENTION

This invention relates to simulators and, more particularly, to devices for the simulation of electrical instruments. In this case, the electrical instrument is a synchroscope which is a dynamometer type of instrument used in the paralleling of alternators (the connection of an alternator to a line to which at least one other alternator is already supplying power).

When an alternator is to be connected to a live power line, the frequency of the alternator must be the same as the frequency of the line. Since alternators are synchronous machines which can be used to generate electricity when driven by another prime mover or as a motor when energized from another source of power, the connection of a rotating alternator to a live power line will result in the alternator being driven as a motor until the frequencies of the alternator output and the line are the same. This imposes a tremendous mechanical strain upon the alternator and its prime mover as well as a heavy drain on the line. In order to provide a smooth coupling of the alternator and the energized line, the phase angle of the alternator output should also be the same as that of the line. To provide the operator of the power plant with the information necessary to accomplish smooth paralleling of alternators, an accurate synchroscope system must be provided.

As important as the synchroscope is to the proper operation of a power plant, it is necessary that the operators learn the correct manner in which to use the synchroscope in order for them to adequately perform their job. For this reason, it is important in the design of power plant simulators that the synchroscope be simulated completely and accurately.

It is, therefore, an object of this invention to provide a new and improved simulator for an electrical instrument.

It is another object of this invention to provide a new and improved simulator for an electrical instrument system.

It is a further object of this invention to provide a new and improved synchroscope simulator.

It is still another object of this invention to provide a new and improved digital simulator for a synchroscope.

Other objects and advantages of this invention will become apparent as the following description proceeds, which description should be considered together with the accompanying drawings.

DESCRIPTION OF A PREFERRED EMBODIMENT

Figure 1:
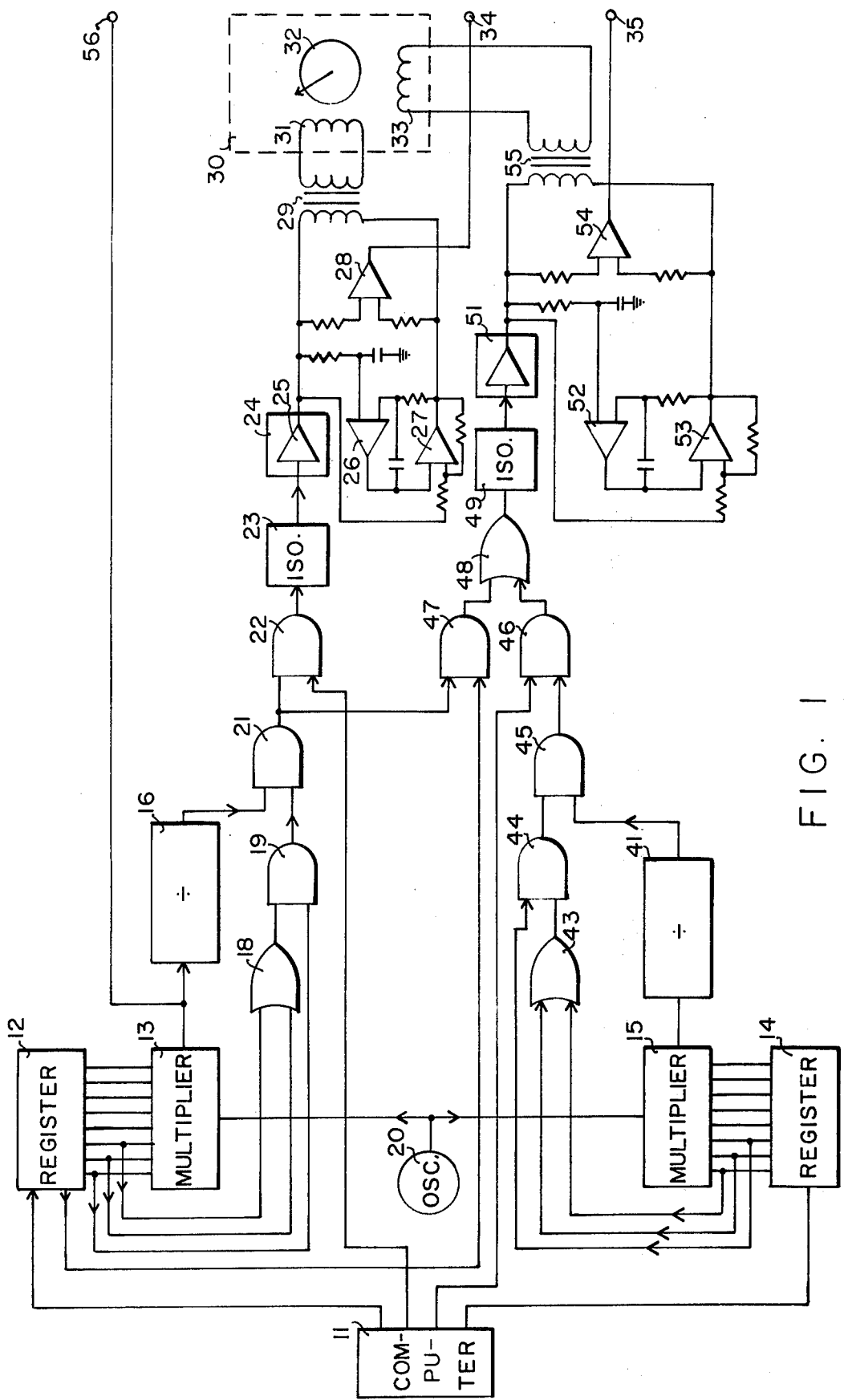
FIG. 1 is a block diagram of the frequency generating portion of the device of this invention.

Referring now to the drawings in detail and, more particularly, to FIG. 1, the reference character 11 designates a general purpose digital computer. The data output from the computer 11 is applied to the inputs of a register 12 and a register 14. The parallel outputs from the register 12 are applied to the input of a frequency multiplier 13, and the parallel outputs from the register 14 are applied to the inputs of a frequency multiplier 15. Applied to another input to each of the multipliers 13 and 15 is the output from an oscillator 20. The output from the multiplier 13 is applied to the input of a frequency divider 16, the output from which is applied to one input of an AND gate 21. The output of multiplier 13 is also applied to terminal 56. The most significant bit from the output of the register 12 is applied to one input of an AND gate 19 whose output is the other input to the gate 21, and the other input to the gate 19 comes from the output of an OR gate 18 which receives as inputs the next two most significant bits from the output of the register 13. The output from the gate 21 is applied as one input to an AND gate 22 whose output is applied through an isolator to the input of an active filter-amplifier 24. The other input to the gate 22 is an on-off signal from the computer 11. In addition to being applied to the input of gate 22, the output from the gate 21 is also applied as an input to an AND gate 47 which receives as another input a bus tie breaker closed signal.

The output from the multiplier 15 is applied to a frequency divider 41 whose output is applied as one input to an AND gate 45, the output of which is applied to one input to an AND gate 46. The other input to the gate 46 is an on-off signal from the computer 11, and the other input to the gate 45 is from the output of an AND gate 44. Gate 44 has two inputs, one is the most significant bit from the output of the register 14 and the other is from the output of an OR gate 43. The two inputs to the gate 43 come from the next two most significant bits from the register 14. The output from the gate 47 and the output from the gate 46 are both applied as inputs to an OR gate 48, whose output is applied through an isolator 49 to the input of an active filter-amplifier 51.

A synchroscope 30 comprises a rotor 32, an incoming winding 33 and a running winding 31. The running winding 31 is energized by the secondary winding of transformer 29 whose primary winding is coupled to amplifier-filter 24 and differential amplifier 27. The outputs of the amplifier filter and the differential amplifier feed opposite ends of the primary winding. A filter-amplifier 26 is connected across the primary winding with the output of the amplifier 26 being applied to one of the two inputs to the amplifier 27. Similarly, the incoming winding 33 is fed from the secondary of a transformer 55. The output of the filter-amplifier 51 is applied to one side of the primary of the transformer 55 and the output of a second differential amplifier 53 feeds the other end of the primary of the transformer 55. A filter-amplifier 52 is connected across the primary of the transformer 55 with the output of the amplifier 52 being applied to one input of the amplifier 53. A differential amplifier 28 is connected across the primary of the transformer 29, and a differential amplifier 54 is connected across the primary of the transformer 55. The amplifiers 28 and 54 generate signals indicative of the phase relative of the two signals.

In the present-day systems for simulating sychroscopes, digital techniques are used so that the entire system may be under the control of digital computers. To this end, the registers 12 and 14 are provided so that digital words from the computer 11 may be used to control the operation of the entire synchroscope system. The multipliers 13 and 15 are typical binary rate multipliers. It should be noted that this system is not limited to binary rate but could be implemented using decade rate multipliers or multipliers operating at any base. The operation of the multipliers 13 and 15 follow the formula:

$$f_{out} = f_{in} [B_1 \times 2^{-1} + B_2 \times 2^{-2} \ldots + B_N 2^{-N}]$$

where $B_1$ through $B_N$ are the control bits from register 12 or 14 and have a value of one or zero. $B_1$ is the most significant bit with $B_N$ the least significant bit. The output of the oscillator 20 is applied as one input to each of the multipliers 13 and 15 and the frequency of the signal from oscillator 20 is affected by the values of the words in the registers 12 and 14 so that the output of the multiplier 13 has a frequency, or bit rate, which is proportional to the frequency of the oscillator 20 times the value of the word in register 12. Since the output of the rate multiplier is an uneven pulse train for almost all combinations of input bits, divider 16 serves as a smoothing filter to reduce the cycle-to-cycle jitter. The operation of the other channel including multiplier 15, register 14 and frequency divider 41 operates the same. The output from the divider 16 is applied through gates 21 and 22 and a photon coupled isolator 23 to the input of the actual synchroscope circuit itself. Gate 22 is used to turn the operation of the system on and off and the other input is an on/off signal from the computer 11. Unless both inputs are present, the synchroscope 30 does not work. Gate 21 has a slightly different function. When the alternators are coming up to speed but their output is still at a very low frequency, the amount of current drawn by the transformers 29 and 55 and by the synchroscope 30 is excessive and could cause serous overheating and damage. For this reason, the three most significant bits from the register 12 are used to control the operation of the synchroscope 30. The most significant bit is applied as one input to the gate 19 and the other two slightly lesser significant bits are ORd together by gate 18 and applied as the other input to the gate 19. Thus, unless the most significant bit and at least one of the next two significant bits are available, there is no output signal from the gate 19 to the gate 21 and the signal output from the divider 16 is not passed on to the synchroscope. In general, the operation of the second channel is essentially the same. The gate 43 ORs together the two nearly most significant bits from the register 14 and applies them as one input to the gate 44 which receives as its other input the most significant bit from the register 14. The output of the gate 44 is combined with the outut from the frequency divider 41 to pass on the frequency signal through the gate 45 to the gate 46. However, the gate 46 has an on/off signal applied to it from the computer 11 to control the operation of the overall circuit. The second channel has an additional gate not present in the first channel and that is gate 47 which receives two signals from the first channel. One is a register signal from the register 12 and the other one is the output of the gate 21 which indicates when there is an output from the frequency divider 16. Only when these two signals are together does gate 47 apply an output to the gate 48. The gate 48 ORs together the output from the two gates 46 and 47 to parallel the outputs of the two channels. The output from the gate 48 is applied through an electrical isolator 49 to the input of the synchroscope circuitry.

Synchroscope 30 comprises a rotor 32, an incoming winding 33 and running windings 31. The running winding 31 is fed from the first channel and the incoming winding 33 is fed from the second channel. The operation of the synchroscope is such that the rotor 32 rotates at a frequency which is equal to the difference between the frequencies applied to the two sets of windings 31 and 33. As the frequencies of the energy in those two windings approach each other, the rotor gradually slows down and, when the frequencies are the same, the rotor 32 comes to rest. Since the two channels are identical, only one will be described. The output of the isolator 23 is applied to the input of an active filter 24 having an amplifier 25. The output of the amplifier 25 feeds one end of the primary of a transformer 29. The filter 24 filters out all of the higher harmonics and leaves only those signals which are at the frequency at which the synchroscope 30 operates. The output from the amplifier 25 is also applied through an input resistor to the inputs of a differential amplifier 26 and a differential amplifier 27. The amplifier 27 feeds the other side of the primary of the transformer 29. Since the output of the amplifier 27 is 180° out of phase with the output of the amplifier 25, current will be flowing through the primary of the transformer 29 during both halves of the cycle. With this push-pull connection, the peak-to-peak voltage at the primary of transformer 29 may exceed the supply voltage of amplifiers 25 and 51. Amplifier 26 senses the voltage drop across the primary of transformer 29. The resistor and capacitor associated with amplifier 26 form an operational integrator and filter out the simulated power line frequency and provide a D.C. correction signal to amplifier 27. This loop corrects for any D.C. drift in amplifiers 25 and 27 and substantially eliminates all the D.C. losses in the transformer 29. An amplifier 28 is connected across the primary winding of the transformer 29 and provides an output which is proportional to the phase angle of the energization in that primary winding. The output of the secondary winding of the transformer 29 is applied to the running winding 31 of the synchroscope 30. The circuit which provides the energization for the incoming winding 33 of the synchroscope 30 is the same as that just described.

The frequency output from the frequency divider 16 is determined by the fixed frequency output of the oscillator 20 in combination with the value of the digital word applied by the computer 11 to the register 12. The same is true with respect to the frequency of the output from the divider 41 except that its frequency depends upon the relationship between the output of the oscillator 20 and the computer input to the register 14. If the output of the frequency divider 16 is considered the electrical net signal, then the value of the digital word applied to the register 14 will determine the frequency output from the divider 41 and the frequency difference between the two sets of windings 31 and 33 of the synchroscope 30. In this manner, the computer 11 can control the changing frequency of the alternator being brought onto the line by changing the value of the word applied to the register 14.

Figure 2:
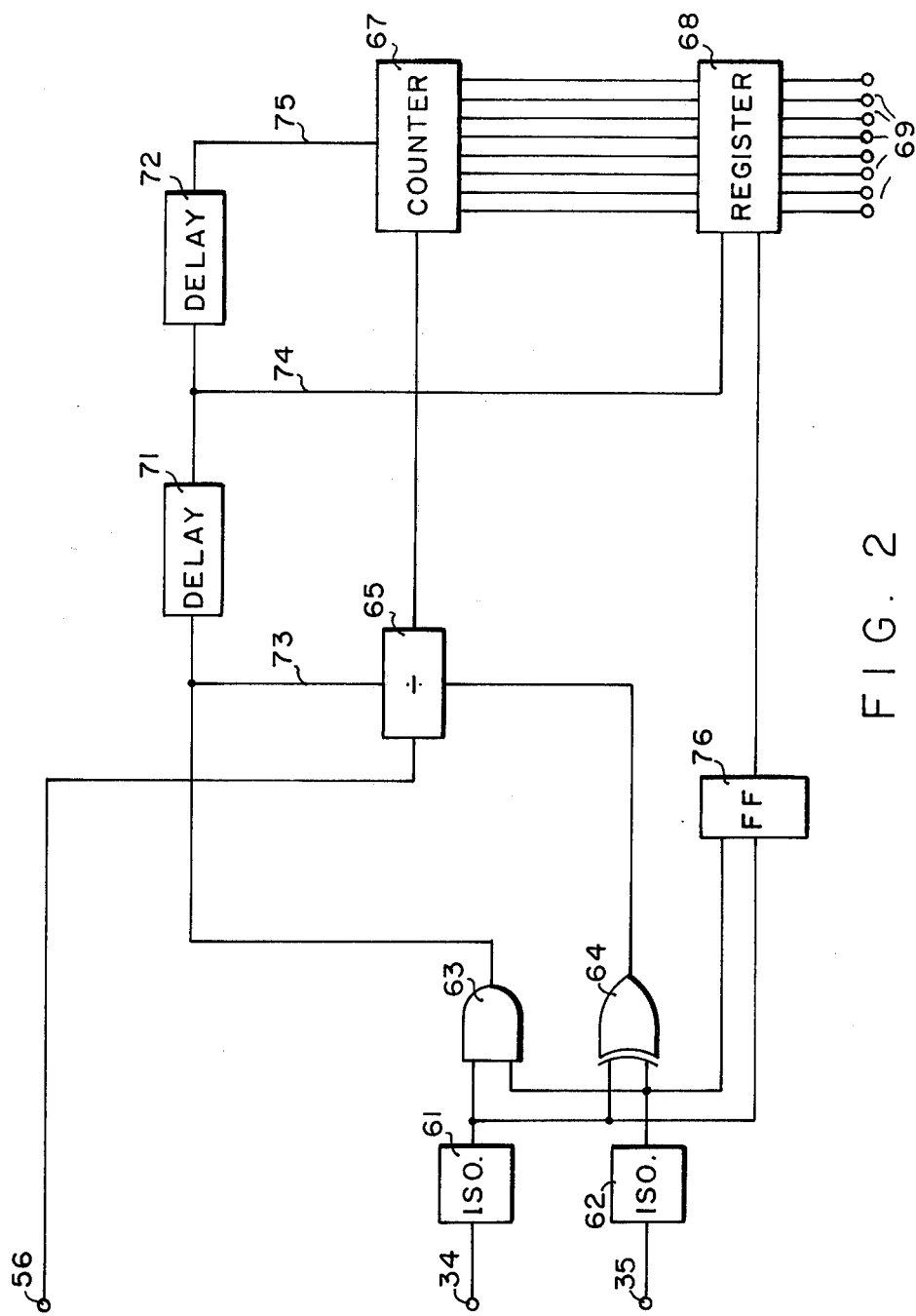
FIG. 2 is a block diagram of the phase comparator of the device of this invention.

FIG. 2 is a block diagram of the phase angle portion of the synchroscope system of this invention. The output from the multiplier 13 is applied to an output terminal 56 on FIG. 1 which is connected to an input terminal 56 on FIG. 2. In fact, the two terminals 56 can be considered the same. The input terminal terminal 56 is connected to an input of a divider 65 whose output is applied to the count input of a counter 67. Also applied to the divider 65 is an inhibit signal which comes from the outut of an AND gate 63, one of whose inputs comes from the terminal 34 through an isolator circuit 61. The output of the isolator 61 is also applied to one input of an exclusive OR gate and to the data input of a flip-flop 76. The terminal 35 is connected to an isolator circuit 62 whose output supplies the set input of the flip-flop 76, the other input to the gate 64 and the other input to the gate 63. The output of the gate 64 is applied to the divider 65 as a reset input. The set output from the flip-flop 76 is applied as a data input to a register 68, whose parallel inputs are connected to the parallel outputs from the counter 67, and whose parallel outputs constitute a digital word representing the phase angle between the signals on terminals 34 and 35. The output of the gate 63 is also applied through a delay 71 as a transfer signal on line 74 to the register 68 and through another delay 72 and a line 75 as a clear signal for the counter 67.

The output from multiplier 13 which is applied through the terminal 56 to the input of the divider 65 represents the frequency of the network voltage. This is divided by the divider 65 so that the output of the divider 65 represents angular degrees, each pulse in to the count input of the counter 67 representing a degree. Thus, so long as the counter 67 receives a count input, it counts degrees. The outputs from both of the channels of FIG. 1 are applied, through isolators 61 and 62, to the two inputs of the exclusive OR gate 64. Gate 64 produces an output only when one of the inputs are high. Thus, there is applied to the on/off input of the divider 65 a signal which turns the divider on only during the interval when the two voltages in the two channels do not overlap. When the output of the gate 64 goes high, the divider transmits degree pulses to the counter 67. When the output of the gate 64 goes low, the divider terminates that transmission and resets divider 65. Thus, the counter 67 counts the number of degrees that the two alternator voltages are out of phase. The outputs from the two channels of FIG. 1 are also applied to the gate 63 which generates an output signal only during the time that both inputs are present. The output of the gate 63 represents the beginning of a new cycle. This output is applied directly to the enable input of the divider 65 whenever the output of the gate 63 goes low. This permits divider 65 to count. The gate 63 output is applied through a delay 71 to the register 68 to cause the register 68 to accept the output of the counter at that time, and, after another delay, that signal is applied to the clear input of the counter 67 to clear that counter to zero for another cycle. A flip-flop 76 receives as a set input pulse the signal from the terminal 35. The signals applied to the terminal 34 is used as a data pulse for the flip-flop 76. Thus, should the signal from terminal 35 be applied first, and then the signal from terminal 34, the flip-flop 76 is set low and applies a low signal to the register 68. If, however, the signal from the terminal 34 is applied first, indicating that the upper channel in FIG. 1 is ahead of the other channel, then a high signal is applied to the register 68 by the flip-flop 76. This indicates the sign of the phase difference. The output from the register 68 applied to output terminals 69 represent the digital representation of the number of degrees difference between the phase of the voltages in the two channels of FIG. 1 and the sign of that difference. This information may be applied back to the computer 11, if desired, to control the operation of the system and to monitor the simulator operator's performance when paralleling alternators.

The above specification has described a new and improved system for simulating the operation of synchroscope systems used in power plants for bringings a new alternator onto an already energized line. It is realized that a reading of the above description may indicate to those skilled in the art additional ways in which the principles of this invention may be used without departing from its spirit. It is, therefore, intended that this invention be limited only by the scope of the appended claims.

What is claimed is:

1. Apparatus for simulating a synchroscope system, said apparatus comprising:
   a first register and a second register;
   a first rate multiplier connected to receive the contents of said first register;
   a second rate multiplier connected to receive the contents of said second register;
   an oscillator connected to said first and second rate multipliers to supply the rate by which the contents of said first and second registers are multiplied;
   at least one source of digital information connected to the inputs of said first and second registers to supply individual digital words representing a frequency to said first and second registers;
   a first filter means coupled to the output of said first multiplier to convert the first multiplier output into a first sinusoidal wave having a frequency equal to the digital word stored in said first register;
   a second filter means coupled to the output of the second multiplier to convert the output of the second multiplier into a second sinusoidal wave having a frequency equal to the digital word stored in said second register;
   means for controlling the output of at least one of said sources of digital words to change the contents of one of said first or second registers as the system operates to bring the values of the contents of said first and second registers closer together; and
   means for transmitting the first and second sinusoidal waves to the two windings of a synchroscope.

2. The apparatus defined in claim 1 further including a first frequency divider connected to the output of said first multiplier, means for coupling the output of said divider to the input of said first filter means, a second frequency divider connected to the output of said second multiplier, and means for coupling the output of said second divider to the input of said second filter.

3. The apparatus defined in claim 1 further including first inhibiting means coupled to the output of said first multiplier for preventing the flow of information from said first multiplier to said first filter means, and means for transmitting an on-off signal to said first inhibiting means to permit and prevent said information from flowing.

4. The apparatus defined in claim 3 further including a second inhibiting means coupled to the output of said second multiplier for preventing the flow of information from said second multiplier to said second filter means, and means for transmitting an on-off signal to said second inhibiting means for causing said second inhibiting means to operate.

5. The apparatus defined in claim 3 further including first interrupting means coupled to the path between said first multiplier and said means for transmitting so that the most significant bits of information in said first register will flow from said first multiplier to said first filter means unless the frequency output from said first filter means is equal to the frequency stored in said first register, a synchronizing means coupled to the path between said second multiplier and said means for transmitting to ensure synchronism of the inputs to said first and second filter means from both of said first and second multipliers.

6. The apparatus defined in claim 1 further including first interrupting means connected to the path between said first multiplier and said means for transmitting so that the most significant bits of information in said first register will flow from said first multiplier to said first filter means unless the frequency output from said first filter is equal to the frequency stored in said first register.

7. The apparatus defined in claim 1 further including a synchronizing means coupled to the path between said second multiplier and said means for transmitting to ensure synchronism of the inputs to said first and second filter means from both of said first and second multipliers.

8. The apparatus defined in claim 1 further including phase difference detector means, said phase detector means comprising a counter, a third register having its parallel inputs connected to the parallel outputs of said counter, means for transmitting the output of said first multiplier to the count input of said counter, a first coincident gate, means for transmitting an output from said first filter means and an output from said second filter means to the inputs of said first gate so that said gate generates an output when said first and second filter means outputs are present at the same time, switch means interposed between said first multiplier and the count input of said counter, means for transmitting the output from said first gate to the input of said switch means to halt the flow of pulses from said first multiplier to said counter, and means for transmitting the output from said first gate to said register to transfer the contents of said counter to said register, said contents representing the phase difference at that time between the outputs of said first and second filter means.

9. The apparatus defined in claim 8 further including a bistable device having a set input and a clock input, means for transmitting the output from said first filter means to said set input, means for transmitting the output from said second filter means to said clock input, and means for transmitting the set output from said bistable device to said register to provide a sign for the phase information contained therein.

10. The apparatus defined in claim 9 further including means responsive to the output from said first gate to clear said counter and reset the apparatus for another cycle.

* * * * *

UNITED STATES PATENT AND TRADEMARK OFFICE
CERTIFICATE OF CORRECTION

PATENT NO. : 4,019,039
DATED : April 19, 1977
INVENTOR(S) : Robert R. Fontaine

It is certified that error appears in the above-identified patent and that said Letters Patent are hereby corrected as shown below:

Col. 3, line 10, "relative" should be --relation--.

Col. 3, last line, "outut" should be --output--.

Col. 5, line 19, "outut" should be --output--.

Signed and Sealed this

Twenty-first Day of February 1978

[SEAL]

Attest:

RUTH C. MASON
Attesting Officer

LUTRELLE F. PARKER
Acting Commissioner of Patents and Trademarks

UNITED STATES PATENT AND TRADEMARK OFFICE
CERTIFICATE OF CORRECTION

PATENT NO. : 4,019,039

DATED : April 19, 1977

INVENTOR(S) : Robert R. Fontaine

It is certified that error appears in the above-identified patent and that said Letters Patent are hereby corrected as shown below:

Insert the following paragraph as the first paragraph of the Specification:

--The Invention herein described was made in the course of or under a contract or subcontract thereunder, with the Department of the Navy.--

Signed and Sealed this

Ninth Day of June 1981

[SEAL]

Attest:

RENE D. TEGTMEYER

Attesting Officer       Acting Commissioner of Patents and Trademarks